(12) United States Patent
Mitsuhashi et al.

(10) Patent No.: US 6,255,199 B1
(45) Date of Patent: Jul. 3, 2001

(54) METHOD OF PRODUCING POLYCRYSTALLINE SILICON

(75) Inventors: Hiroshi Mitsuhashi, Kumagaya; Yoshito Kawakyu, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/413,539

(22) Filed: Oct. 6, 1999

(30) Foreign Application Priority Data

Oct. 6, 1998 (JP) .................................................. 10-284268

(51) Int. Cl.[7] .................................................. H01L 21/20
(52) U.S. Cl. .......................... 438/486; 438/487; 438/795; 438/798; 427/554
(58) Field of Search ...................... 438/487, 486, 438/795, 798, 166, FOR 101; 427/8, 9, 10, 554, 555, 558

(56) References Cited

U.S. PATENT DOCUMENTS

| 4,330,363 | * | 5/1982 | Biegesen et al. | 156/620 |
|---|---|---|---|---|
| 5,529,937 | * | 6/1996 | Zhang et al. | 437/10 |
| 5,529,951 | * | 6/1996 | Noguchi et al. | 437/174 |
| 5,614,426 | * | 3/1997 | Funada et al. | 437/40 |
| 5,712,191 | * | 1/1998 | Nakajima et al. | 437/174 |
| 5,756,364 | * | 5/1998 | Tanaka et al. | 437/21 |
| 5,766,989 | * | 6/1998 | Maegawa et al. | 438/166 |
| 5,834,071 | * | 10/1998 | Lin | 427/578 |
| 5,837,569 | * | 11/1998 | Makita et al. | 438/166 |
| 5,970,368 | * | 10/1999 | Sasaki et al. | 438/487 |
| 5,970,369 | * | 10/1999 | Hara et al. | 438/488 |

FOREIGN PATENT DOCUMENTS 9-129573   5/1997   (JP) .

OTHER PUBLICATIONS

Jhon et al. (Crystallization of Amorphous Silicon by Excimer Laser Annealing with a Line Shape Beam Having a Gaussian Profile, Jpn. J. Appl. Phys. vol. 33 (1994), pp. L1438–L1441).*

Brotherton, et al. (Beam Shape Effects with Excimer Layer Crystallisation of Plasma Enhanced and Low Pressure Chemical Vapor Deposited Amorphous Silicon, Solid State Phenomena vols. 37–38 (1994) pp. 299–304).*

* cited by examiner

*Primary Examiner*—Eddie C. Lee
*Assistant Examiner*—N. Drew Richards
(74) *Attorney, Agent, or Firm*—Pillsbury Winthrop LLP

(57) ABSTRACT

A thin film transistor to be adapted to each pixel switch in a liquid crystal display has a polycrystalline silicon layer which is acquired by crystallizing amorphous silicon deposited on a glass substrate by laser annealing. A characteristic curve indicating the intensity distribution of a laser beam in this laser annealing has a peak shifted on the upstream side in the direction the glass substrate is moved. In the laser annealing of amorphous silicon, the laser beam is irradiated on the amorphous silicon in such a way that a higher-intensity portion of the laser beam hits the amorphous silicon first. This can make the fluence margin of a laser beam in laser annealing wide enough to achieve a high field-effect mobility and a high yield.

5 Claims, 2 Drawing Sheets

METHOD OF PRODUCING POLYCRYSTALLINE SILICON

BACKGROUND OF THE INVENTION

The present invention relates to a method of fabricating thin film transistors to be used in pixel switches of a liquid crystal display and in a driving circuit therefore, and, more particularly, to a method of producing polycrystalline silicon of which a thin film transistor is comprised.

Today, liquid crystal displays to whose pixel switches insulated gate thin film transistors using amorphous silicon are adapted are mass-produced. Since the field-effect mobility of amorphous silicon is equal to or less than 1 $cm^2/Vs$, however, such a liquid crystal display has a difficulty in outputting a high-chroma image at a high speed.

As a solution to this problem, liquid crystal displays to whose pixel switches thin film transistors using polycrystalline silicon having a relatively high field-effect mobility are adapted are being put to a practical use. This polycrystalline silicon (hereinafter called "polysilicon") is produced by laser annealing which irradiates a laser beam from an excimer laser on amorphous silicon to crystallize it. It is known through experiments that the polysilicon shows a field-effect mobility of about 100 $cm^2/Vs$ to 200 $cm^2/Vs$. Therefore, a liquid crystal display whose thin film transistors use polycrystalline silicon having a high field-effect mobility can output a high-chroma image fast.

It is known that the greater the particle size of polysilicon becomes, the higher the field-effect mobility of polysilicon gets. It is also known that the particle size of polysilicon depends on the energy density (fluence) of a laser beam which is irradiated on amorphous silicon by laser annealing. In other words, increasing the fluence of the laser beam can increase the particle size of polysilicon, thereby making the field-effect mobility higher.

When the fluence of a laser beam exceeds a certain value, the particles of polysilicon have a microcrystal size, so that the desired field-effect mobility cannot be acquired. The fluence of a laser beam should therefore be adjusted to fall within a range which can achieve the desired field-effect mobility. That is, the fluence of a laser beam is adjusted to range from a fluence F1 at which the minimum field-effect mobility needed for fast output of a high-chroma image can be obtained to a fluence F2 over which the particle size of polysilicon becomes a microcrystal size.

At present, however, the fluence margin from F1 to F2 is so narrow that a slight variation of the oscillation intensity of a laser causes the fluence to go off this fluence margin. This makes it difficult to acquire the desired particle size or the desired field-effect mobility. This results in a poor yield and an increase in the production cost at the time of producing the aforementioned high-performance polysilicon.

BRIEF SUMMARY OF THE INVENTION

Accordingly, it is an object of the present invention to provide a method of producing polysilicon, which can make the fluence margin of a laser beam in laser annealing to crystallize amorphous silicon wide enough to achieve a high field-effect mobility and a high yield.

To achieve this object, the present inventors have studied the correlation between a beam profile along the scan direction of a laser beam to be irradiated on amorphous silicon and the fluence margin and found out that the fluence margin can be made sufficiently wide when a laser beam having the following beam profile is used.

A method of producing polycrystalline silicon according to this invention comprising the step of: depositing a non-monocrystalline silicon layer on a substrate; and scanning a region of the non-monocrystalline silicon layer with a laser beam in a first direction, thereby crystallizing the non-monocrystalline silicon of the region, the laser beam forming an elongated beam spot on the non-monocrystalline silicon layer, the beam spot extending in a second direction perpendicular to the first direction, wherein the laser beam has an intensity distribution in the first direction, the distribution being one indicated by a convex curve which includes a peak representing a maximum intensity and which has a radius of curvature of 0.2 $\mu$m to 4 $\mu$m when maximum intensity is represented by a distance of 1 m.

According to this method, the peak on the curve is shifted form a midpoint of the curve.

Alternatively, the peak on the curve is shifted from a midpoint of the curve in the first direction.

The method according to this invention may further comprises a step of scanning another region of the non-monocrystalline silicon layer with the laser beam in the first direction, the other region being adjacent to the region already scanned, with respect to the second direction.

According to this method, the curve has a shape quantified by applying laser beams to different regions of a target at predetermined pulse rates, respectively, the laser beams having different energy densities gradually varying from an energy density of the laser beam to be applied to the non-monocrystalline silicon layer, by acquiring distributions of energy densities of the laser beams from conditions of the regions applied with the laser beams and by combining the distributions of energy densities on the regions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A preferred embodiment of the present invention will now be described in detail with reference to the accompanying drawings.

Figure 1:
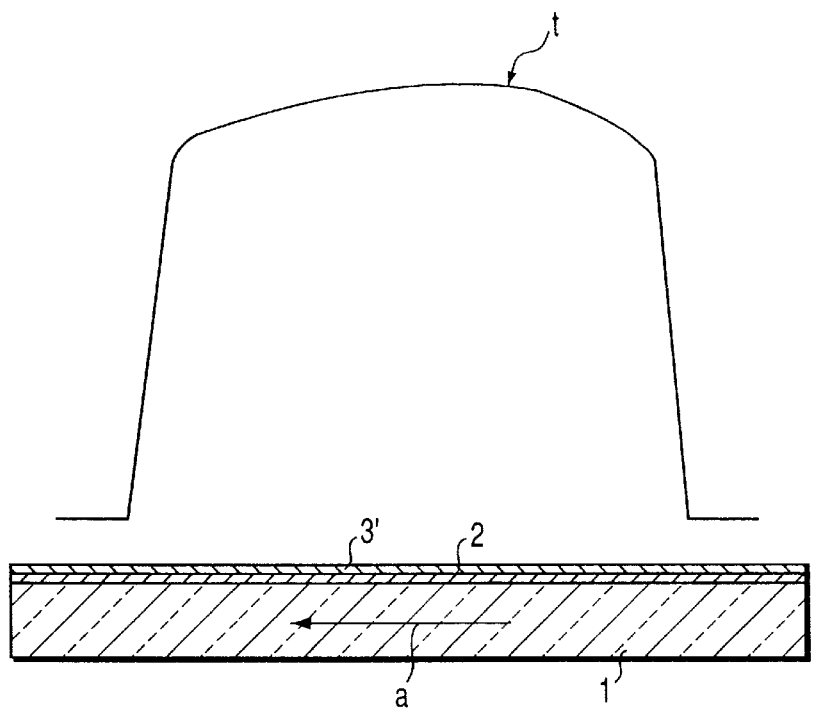
FIG. 1 is a diagram exemplarily illustrating a beam profile along the scan direction of a laser beam to be irradiated on amorphous silicon deposited on a glass substrate.

FIG. 1 exemplarily shows a beam profile (intensity distribution) along the scan direction of the substrate to be irradiated on an amorphous silicon layer 3' in a laser annealing step in a method of producing polycrystalline silicon (polysilicon) according to this invention. A characteristic curve which shows this beam profile is formed like a trapezoid close to an approximately rectangle. The portion that corresponds to the upper side of the trapezoid is called a plateau region, and the portion that corresponds to each oblique side of the trapezoid is called a steepness region. This beam profile will be discussed later specifically.

In producing polysilicon, first, a glass substrate 1 is placed on an unillustrated XY stage and an undercoat layer 2 of SiNx and SiOx is formed on the top surface of the glass substrate 1 by plasma CVD. Then, the amorphous silicon layer 3' is formed 50 nm thick on the undercoat layer 2 by plasma CVD, then the glass substrate 1 is moved at a constant velocity in the direction of the arrow a in the figure. Then, a laser beam from an XeCl excimer laser which has such a beam profile as shown in FIG. 1 is irradiated on the amorphous silicon layer 3' at a pulse of 300 Hz. This laser annealing crystallizes the amorphous silicon layer 3' to thereby form a polysilicon layer 3.

At this time, the laser beam forms on the amorphous silicon layer 3' an elongated linear beam spot extending in the direction (the direction toward the sheet) perpendicular to the scan direction. This beam spot has an approximately rectangular shape with, for example, a length of 200 mm along the direction toward the sheet and a width of 400 μm along the scan direction. The moving speed of the glass substrate 1 is set to 6 mm/sec so that this linear spot overlaps the previous one by 95% in the scan direction or the widthwise direction of the spot.

With the polysilicon layer 3 formed under the above laser annealing conditions, the desired crystal particle size that can increase the field-effect mobility could be acquired when the fluence relating to the energy density of the laser beam was set between 320 mJ/cm$^2$ to 380 mJ/cm$^2$. That is, the fluence margin of the laser beam could be made significantly wider as compared with the prior art.

The details of the beam profile of the laser beam will now be discussed.

The shape or beam profile of the characteristic curve of a laser beam as shown in FIG. 1 can be quantified by irradiating the laser beam on different regions of the amorphous silicon layer 3' pulse by pulse and observing the state of each laser beam with a microscope and can be controlled by adjusting the optical members that constitute the optical system which transmits the laser beam.

There is another method which uses a CCD beam profiler to quantify the shape of the characteristic curve. As the CCD beam profiler has an intensity resolution of only about 5%, however, it cannot detect an intensity in the intensity distribution of less than 5% and cannot quantify the beam profile of a laser beam at a high precision.

To generate a laser beam having such a beam profile as shown in FIG. 1, therefore, the beam profile is adjusted by quantifying the shape of the characteristic curve indicating the beam profile in the manner discussed below according to this embodiment.

In quantifying the shape of the characteristic curve, first, an undercoat layer is formed on a glass substrate for a sample, and an amorphous silicon layer is then formed on the undercoat layer. Then, laser beams with different fluences are irradiated on different regions on the amorphous silicon pulse by pulse by gradually changing the fluence of the laser beam around a value set in the actual laser annealing while monitoring the fluence of the laser beam by using an energy meter or power meter.

Figure 2A:
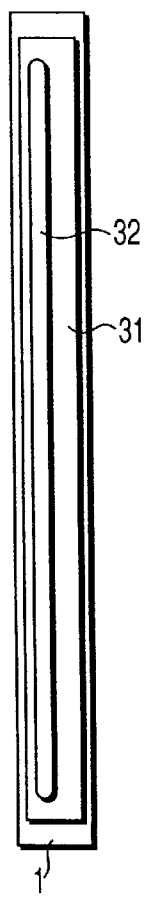
FIGS. 2A through 2C are diagrams for explaining how to quantify the beam profile of a laser beam.
Figure 2B:
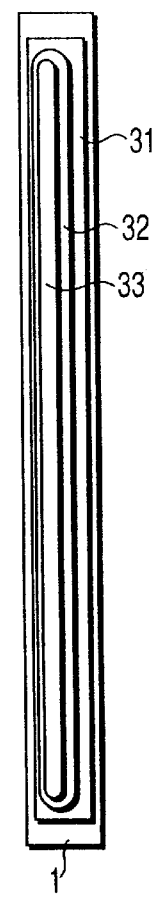
Figure 2C:
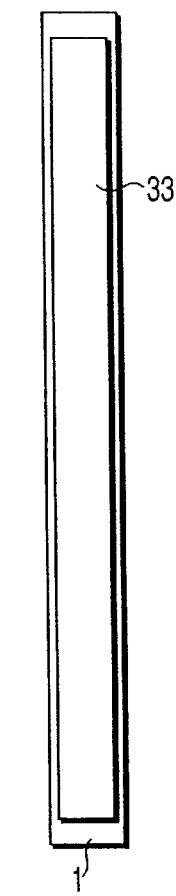

FIGS. 2A through 2C respectively illustrate the results of microscopic observation of the beam spots of three laser beams with different fluences on amorphous silicon. FIG. 2A shows the state of the spot of a laser beam whose fluence relating to the irradiation energy density is set 300 mJ/cm$^2$, FIG. 2B shows the state of the spot of a laser beam whose fluence is set 320 mJ/cm$^2$ and FIG. 2B shows the state of the spot of a laser beam whose fluence is set 340 mJ/cm$^2$. The beam spot in FIG. 2A has a generally yellow region 31 and a red region 32 in that region 31. The beam spot in FIG. 2B has a generally yellow region 31, a red region 32 in that region 31 and a green region 33 in that region 32. The beam spot in FIG. 2C has a generally green region 33.

It is understood that the yellowish region is where a laser beam with a low energy density is irradiated and as the energy density of the laser beam to be irradiated increases, the color of the target region will become reddish, greenish yellow or yellowish green. It is apparent that when the energy density gets higher, the color of the entire region where the laser beam is irradiated becomes greenish yellow.

Figure 3:
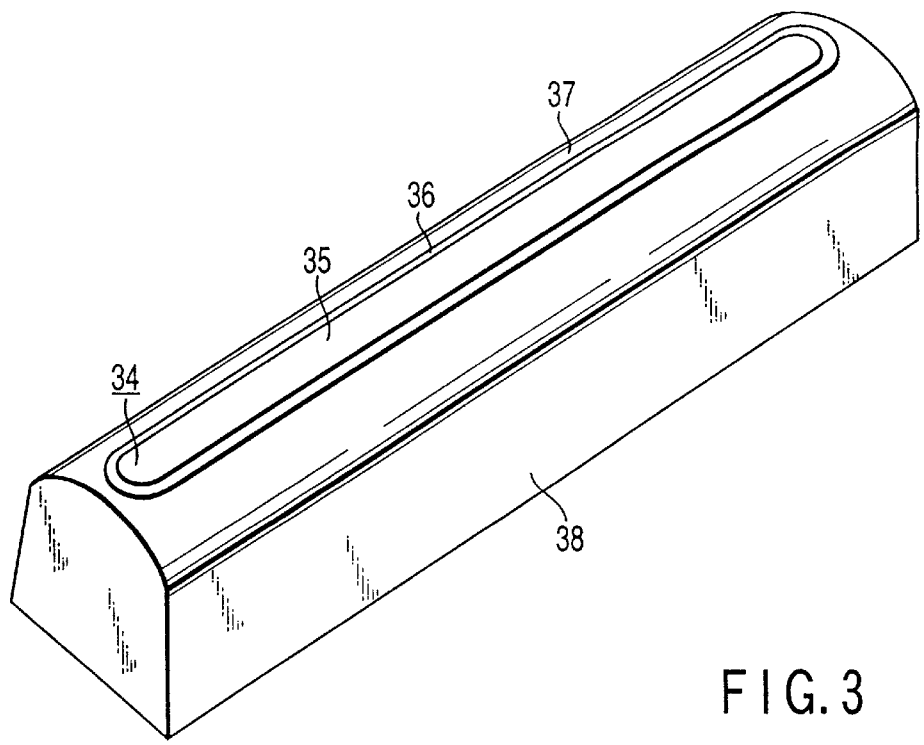
FIG. 3 is a diagram three-dimensionally showing a quantified beam profile.

The characteristic curve indicative of the beam profile can be quantified by combining data of the individual beam spots with the boundaries of those regions of different colors as contour lines. In this case, the heights of the individual contour lines can be defined on the basis of the fluences of the laser beams that have been monitored by the energy meter. FIG. 3 three-dimensionally shows the characteristic curve of the beam profile that has been quantified by the above-described scheme.

It is apparent from this figure that a region 35 with the maximum energy density is formed in the center portion of an approximately flat plateau region 34 which is decentered on one side, a region 36 with an intermediate energy density and a region 37 with a low energy density are formed in order around this region 35, and a steepness region 38 whose energy density drops abruptly is formed around the region 37.

Based on the beam profile quantified in the above manner, the optical members that constitute the optical system for transmitting a laser beam are adjusted to generate a laser beam having such a beam profile as shown in FIG. 1.

The plateau region of the laser beam having such a controlled beam profile according to this embodiment is slightly bent in a convex shape having a single peak t showing the maximum intensity (see FIG. 1). The curvature of the plateau region is approximated to a radius of curvature of 0.2 μm to 4 μm when the energy density at the peak t is represented by a distance of 1 m. According to this embodiment, a laser beam whose beam profile provided the radius of curvature of 0.7 μm when the energy density at the peak t is represented by a distance of 1 m was used to laser-anneal amorphous silicon.

Designing the characteristic curve of the plateau region into a convex shape can allow the energy density along the widthwise direction of the spot of the laser beam to be irradiated on the amorphous silicon layer 3' to have a distribution. Accordingly, the crystal nucleus can be maintained in the liquefaction of the amorphous silicon layer 3' on the glass substrate 1 which is moved in the direction of the arrow a, and the speed of solidification in the widthwise direction can be given a time lag in the later solidifying process, so that crystal growth in the widthwise direction can be accelerated.

When the radius of curvature of the plateau region is set equal to or greater than 4 μm or is set almost linearly, by way of contrast, the energy density along the widthwise direction becomes approximately the same and the probability that the crystal nucleus will disappear in the melting process of the amorphous silicon layer 3' becomes high, so that spontaneous solidification is promoted in the later solidifying process.

When the radius of curvature of the plateau region is set equal to or smaller than 0.2 μm, the timings of solidification of adjoining regions in the solidification of the amorphous silicon layer 3' do not overlap and the amorphous silicon layer 3' is solidified without any influence between the adjoining regions. This narrows the fluence margin.

According to this embodiment, in view of the above, a laser beam whose beam profile provides the plateau region with a curvature of 0.2 to 4 μm was used with a successful result of having made the fluence margin as wide as possible while maximizing the crystal particle size of silicon. Particularly, setting the radius of curvature to 0.7 μm as in this embodiment could provide a wide fluence margin of 320 mJ/cm² to 380 mJ/cm².

According to a more preferable example of this invention, the position of the peak t in the aforementioned plateau region is shifted upstream in the moving direction of the glass substrate 1 from the center of the plateau region. That is, at the time of scanning with a laser beam, the portion of the laser beam at the peak t which has the highest energy density is irradiated first on the amorphous silicon layer 3' and a portion with a lower energy density which is off the peak portion t will then be irradiated.

More specifically, as scanning with the laser bear to be irradiated on the amorphous silicon layer 3' is carried out at a pulse width of 300 Hz so that 95% of the laser beam overlaps with the previous one, the laser beam is irradiated twenty times on a given portion on the amorphous silicon layer 3'. As the peak t with the highest energy density is shifted in the scan direction as in this embodiment, the region where beam irradiation will take place twenty times will be solidified with a priority over other regions.

Even when laser oscillation with an undesirably high energy density exceeding the fluence margin occurs, therefore, irradiation of a laser beam with a relatively lower energy density after the peak t can prevent microcrystallization of silicon and can thus ensure a wider fluence margin.

As a comparison to the laser beam of this invention that has the above-described beam profile, the Gaussian beam whose beam profile is close to a normal distribution is known. The characteristic curve of this Gaussian beam along the widthwise direction is close to a right-angled isosceles and is essentially different from the characteristic curve whose beam profile has a trapezoidal shape close to a rectangle as in this invention. On the assumption that the beam width is twice the standard deviation for the normal distribution, the radius of curvature if computed under the same conditions of the above-described embodiment becomes approximately 0.058 μm, far off the range of the radius of curvature that is defined in this invention.

Figure 4:
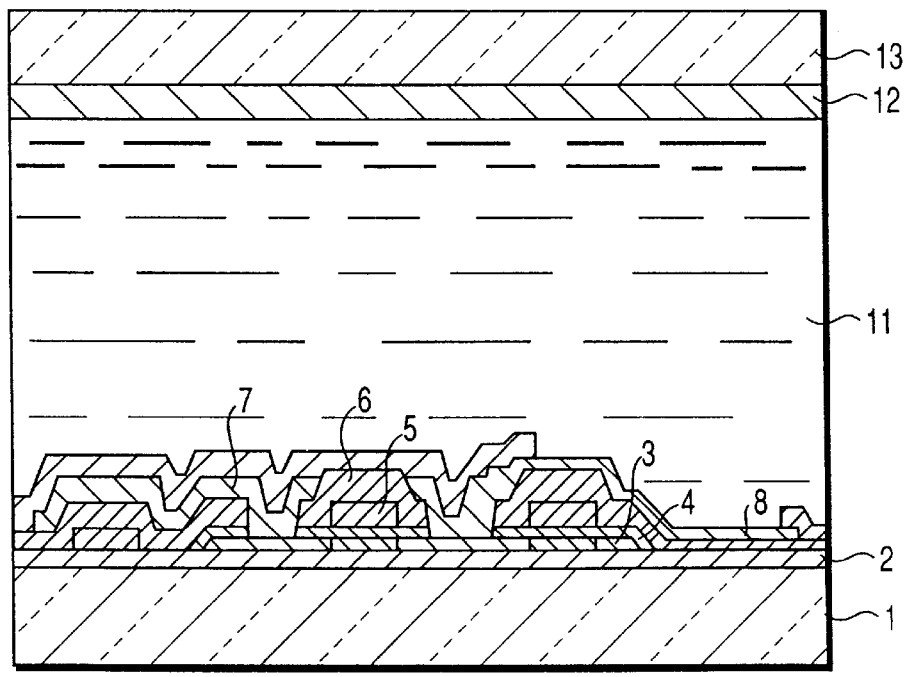
FIG. 4 is a cross-sectional view of a liquid crystal display equipped with thin film transistors each having a polysilicon layer produced by laser annealing using a laser beam which has such a beam profile as shown in FIG. 1.

FIG. 4 presents a cross-sectional view of a thin film transistor containing polysilicon produced by the above-described method and a liquid crystal display which is equipped with this thin film transistor.

In manufacturing this liquid crystal display, first, the undercoat layer 2 of SiNx and SiOx is formed on the glass substrate 1 with a size of 400 mm×500 mm by plasma CVD, and then the amorphous silicon layer 3' is formed 50 nm thick on the undercoat layer 2 by plasma CVD. Then, the glass substrate 1 with the amorphous silicon layer 3' deposited thereon is subjected to a heat treatment for one hour under the nitrogen environment at 500° C. to thereby reduce the hydrogen concentration in the silicon film. The actual thickness of the amorphous silicon layer 3' measured later by spectroscopic ellipsometry was 50.5 mm.

Subsequently, the amorphous silicon layer 3' is laser-annealed with the laser beam that has the above-described beam profile of this invention. At this time, the glass substrate 1 is moved in the direction of the arrow a (see FIG. 1) at 6 mm/s and the linear laser beam with a size of 200 mm×0.4 mm whose fluence on the amorphous silicon layer 3' becomes 350 mJ/cm² is irradiated on the amorphous silicon layer 3' at an oscillation rate of 300 Hz so that 95% of overlapping occurs.

Then, another region adjacent to the laser-annealed region in a direction perpendicular to the scan direction is likewise subjected to laser annealing. At this time, the glass substrate 1 is moved again in the direction of the arrow a and the linear laser beam having the aforementioned beam profile is irradiated from the same direction. In other words, beam scanning is performed in such a way that the peak-side portion t of the laser beam which has the highest energy density hits that another region first. In this manner, the amorphous silicon layer 3' on the glass substrate 1 is crystallized to form the polysilicon layer 3.

Then, thin film transistors are fabricated from the thus formed polysilicon layer 3 using the well-known photolithography and an active matrix liquid crystal display using those thin film transistors is then manufactured. The detailed descriptions of a method of manufacturing the thin film transistors and the liquid crystal display will not be given here, except that each thin film transistor has a gate oxide film 4, a gate electrode 5, an interlayer insulating film 6, a source/drain electrode 7, a pixel electrode and a protection film 9 in addition to the polysilicon layer 3, and the liquid crystal display comprises a liquid crystal 11, an opposing electrode 12 and an opposing substrate 13 in addition to the thin film transistors.

According to this embodiment, as described above, because polysilicon is produced by laser annealing using a laser beam having such a beam profile as shown in FIG. 1 in the scan direction, the laser beam to be irradiated on the amorphous silicon layer can be provided with a wide fluence margin so that polysilicon with a high field-effect mobility can be produced at a high yield. This can guarantee mass-production of thin film transistors having excellent characteristics which leads to the manufacture of a high-quality liquid crystal display.

It should be apparent to those skilled in the art that the present invention is not to be limited to the above-described embodiment, but may be modified in various forms within the scope of the appended claims.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of producing polycrystalline silicon, comprising the step of:

depositing a non-monocrystalline silicon layer on a substrate; and scanning a region of the non-monocrystalline silicon layer with a laser beam in a first direction, thereby crystallizing the non-monocrystalline silicon of the region, said laser beam forming an elongated beam spot on the non-monocrystalline silicon layer, said beam spot extending in a second direction perpendicular to the first direction, wherein the laser beam has an intensity distribution in the first direction, said distribution being one indicated by a convex curve which includes a peak representing a maximum intensity and which has a radius of curvature of 0.2 $\mu$m to 4 $\mu$m when maximum intensity is represented by a distance of 1 m.

2. The method according to claim 1, wherein the peak on the curve is shifted form a midpoint of the curve.

3. The method according to claim 1, wherein the peak on the curve is shifted from a midpoint of the curve in the first direction.

4. The method according to claim 1, further comprises a step of scanning another region of the non-monocrystalline silicon layer with the laser beam in the first direction, said other region being adjacent to the region already scanned, with respect to the second direction.

5. The method according to claim 1, wherein the curve has a shape quantified by applying laser beams to different regions of a target at predetermined pulse rates, respectively, said laser beams having different energy densities gradually varying from an energy density of the laser beam to be applied to the non-monocrystalline silicon layer, by acquiring distributions of energy densities of the laser beams from conditions of the regions applied with the laser beams and by combining the distributions of energy densities on the regions.

\* \* \* \* \*